(12) United States Patent
Lee

(10) Patent No.: US 8,299,468 B2
(45) Date of Patent: Oct. 30, 2012

(54) DISPLAY SUBSTRATE HAVING REDUCED DEFECTS

(75) Inventor: Eun-Guk Lee, Gyeonggi-do (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 13/207,378

(22) Filed: Aug. 10, 2011

(65) Prior Publication Data
US 2011/0291099 A1 Dec. 1, 2011

Related U.S. Application Data

(62) Division of application No. 11/644,195, filed on Dec. 21, 2006, now Pat. No. 8,012,813.

(30) Foreign Application Priority Data

Dec. 21, 2005 (KR) ................. 2005-127121

(51) Int. Cl.
| | |
|---|---|
| H01L 29/04 | (2006.01) |
| H01L 29/10 | (2006.01) |
| H01L 31/036 | (2006.01) |
| H01L 31/0376 | (2006.01) |
| H01L 31/20 | (2006.01) |
| H01L 29/15 | (2006.01) |
| H01L 27/148 | (2006.01) |
| H01L 29/74 | (2006.01) |
| H01L 29/768 | (2006.01) |
| H01L 29/80 | (2006.01) |
| H01L 31/112 | (2006.01) |
| H01L 31/062 | (2006.01) |
| H01L 31/113 | (2006.01) |
| H01L 31/00 | (2006.01) |

(52) U.S. Cl. ............ 257/59; 257/72; 257/222; 257/258; 257/291; 257/440; 257/E33.001; 257/E33.064

(58) Field of Classification Search .................. 257/59, 257/72, 222, 258, 291, 440, E33.001, E33.064
See application file for complete search history.

(56) References Cited

U.S. PATENT DOCUMENTS

| | | | | |
|---|---|---|---|---|
| 5,852,485 | A * | 12/1998 | Shimada et al. | 349/141 |
| 6,259,500 | B1 * | 7/2001 | Kijima et al. | 349/113 |
| 6,281,958 | B1 * | 8/2001 | Nakajima | 349/141 |
| 6,356,318 | B1 * | 3/2002 | Kawahata | 349/38 |

(Continued)

FOREIGN PATENT DOCUMENTS

KR 1020020078294 A 10/2002

(Continued)

*Primary Examiner* — Ida M Soward
(74) *Attorney, Agent, or Firm* — Innovation Counsel LLP

(57) ABSTRACT

A three mask process for forming an LCD substrate includes, depositing in sequence on a base substrate a gate metallic layer, a gate insulation layer and a channel layer. A first photoresist pattern is used to form a gate electrode of a switching device, a channel pattern and a gate line on the gate electrode. A transparent conductive layer and a source metallic layer are deposited in sequence on the base substrate having the channel pattern. A source electrode and a drain electrode of the switching device, a pixel electrode and a source line electronically connected to the drain electrode, are formed by a second photoresist pattern. A first protective insulation layer is formed, and the first protective insulation layer on the pixel electrode is removed by a third photoresist pattern. Therefore, by the three masks process yields a simplified manufacturing process in which the lower portion of the source metallic pattern is not formed and display quality is improved.

5 Claims, 17 Drawing Sheets

U.S. PATENT DOCUMENTS

| | | | |
|---|---|---|---|
| 6,400,425 B1 * | 6/2002 | Kim et al. | 349/40 |
| 6,452,654 B2 * | 9/2002 | Kubo et al. | 349/114 |
| 6,524,876 B1 | 2/2003 | Baek et al. | |
| 6,568,978 B2 * | 5/2003 | Kataoka et al. | 445/24 |
| 6,621,537 B1 * | 9/2003 | Nakamura et al. | 349/43 |
| 6,818,923 B2 | 11/2004 | Kim et al. | |
| 6,864,134 B1 * | 3/2005 | Satou et al. | 438/197 |
| 6,885,110 B1 | 4/2005 | Ogawa | |
| 6,900,852 B2 * | 5/2005 | Okada et al. | 349/39 |
| 6,950,159 B2 * | 9/2005 | Kubo et al. | 349/114 |
| 7,323,716 B2 * | 1/2008 | Satou et al. | 257/66 |
| 7,547,918 B2 * | 6/2009 | Azumada et al. | 257/72 |
| 7,612,376 B2 * | 11/2009 | Yamazaki et al. | 257/66 |
| 7,688,405 B2 * | 3/2010 | Jang et al. | 349/114 |
| 7,800,118 B2 * | 9/2010 | Byun et al. | 257/79 |
| 7,923,729 B2 * | 4/2011 | Sawamizu et al. | 257/59 |
| 2001/0035527 A1 | 11/2001 | Tanaka et al. | |
| 2002/0052057 A1 | 5/2002 | Wong | |
| 2002/0159010 A1 | 10/2002 | Maeda et al. | |
| 2003/0038910 A1 * | 2/2003 | Nagano et al. | 349/113 |
| 2004/0171200 A1 | 9/2004 | Maeda et al. | |
| 2004/0183970 A1 * | 9/2004 | Niiya | 349/114 |
| 2004/0195571 A1 | 10/2004 | Ahn et al. | |
| 2004/0195574 A1 | 10/2004 | Ahn et al. | |
| 2005/0124088 A1 | 6/2005 | Chen | |
| 2006/0044487 A1 * | 3/2006 | Okada et al. | 349/46 |
| 2006/0121634 A1 | 6/2006 | Ahn | |
| 2007/0166894 A1 | 7/2007 | Lim | |
| 2008/0003726 A1 | 1/2008 | Park | |

FOREIGN PATENT DOCUMENTS

KR        1020040086925 A     10/2004

* cited by examiner

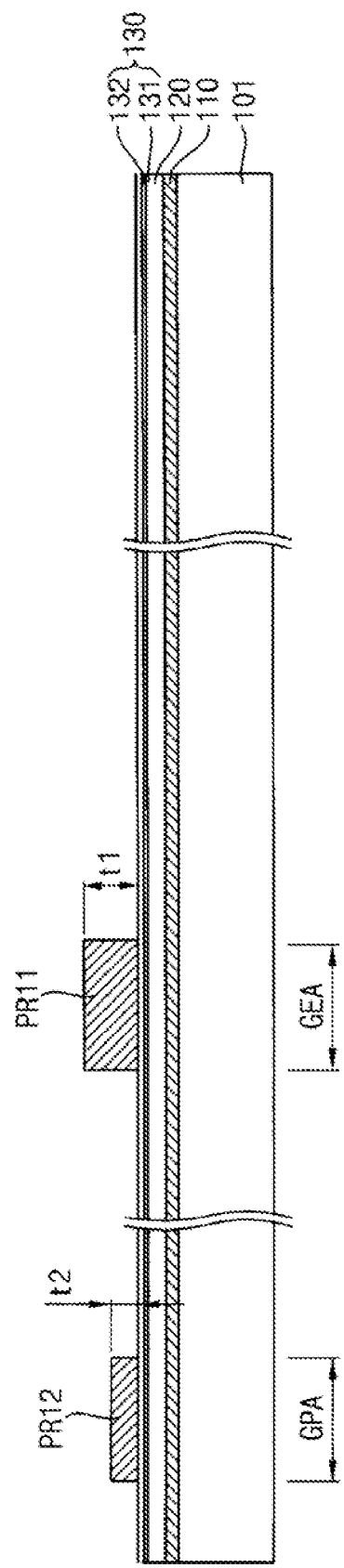

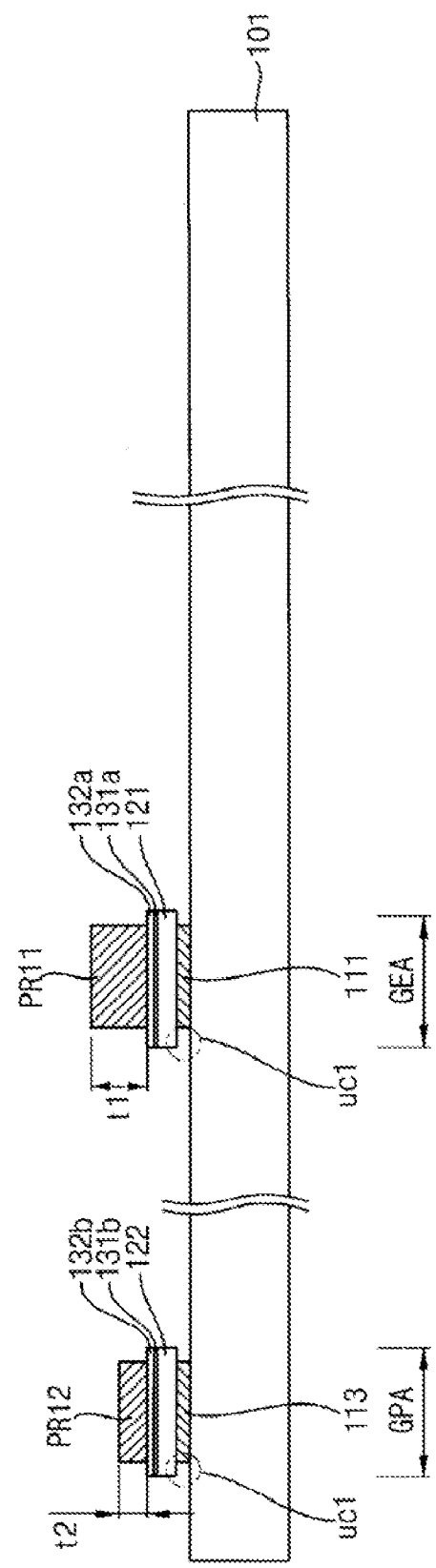

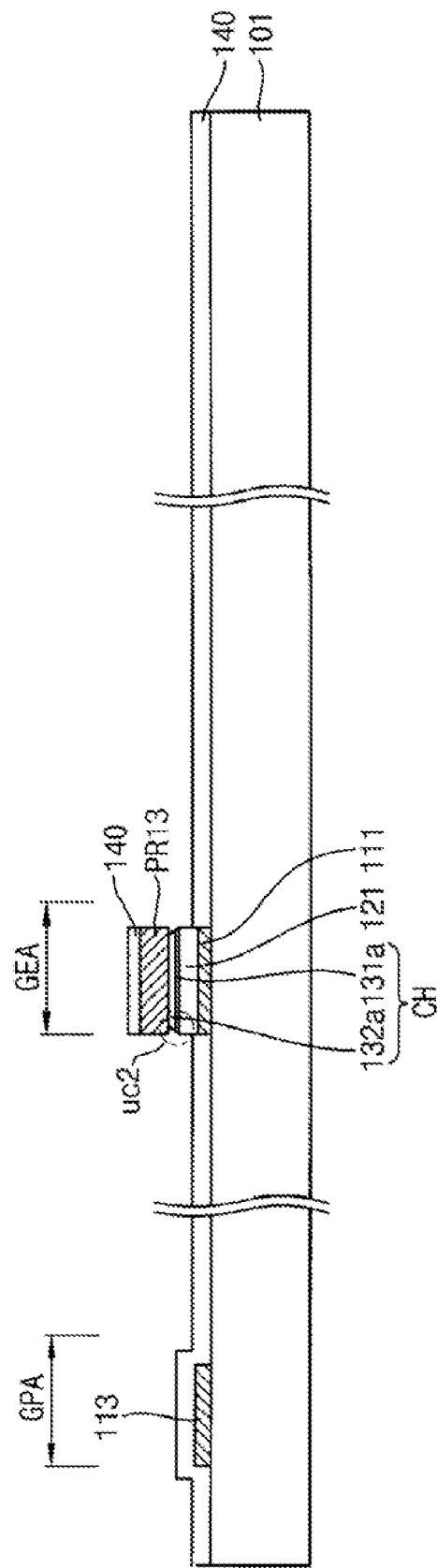

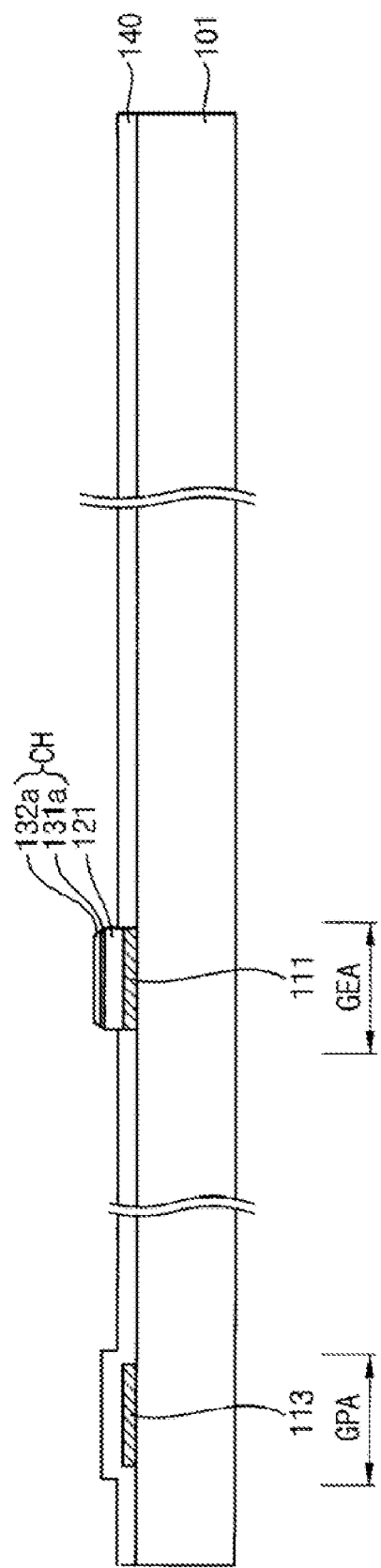

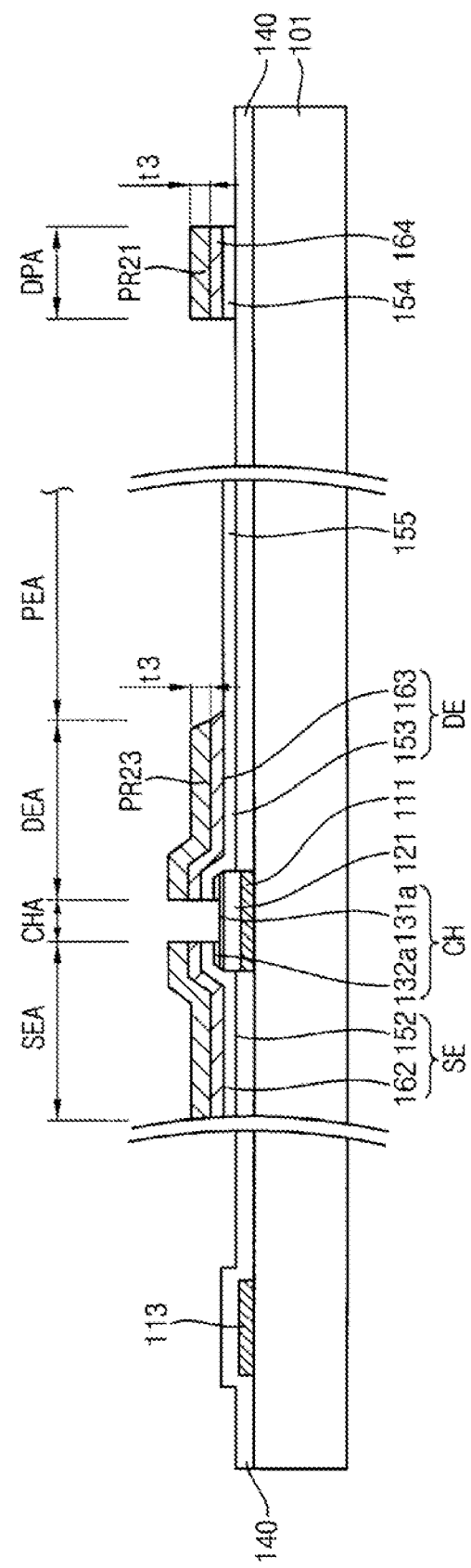

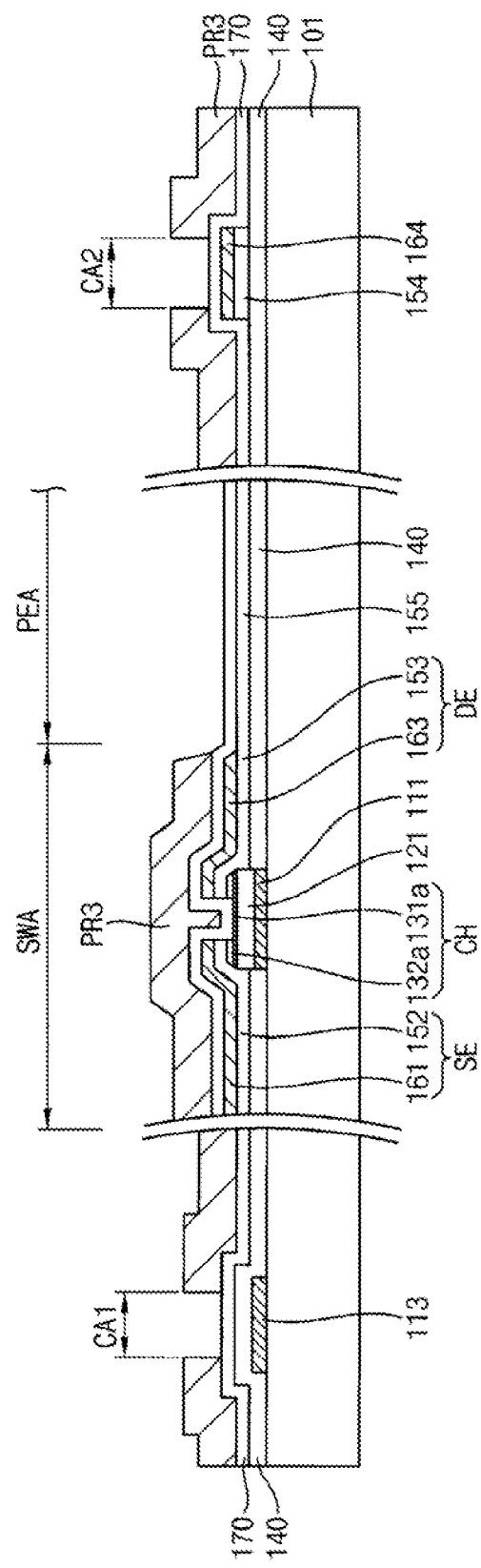

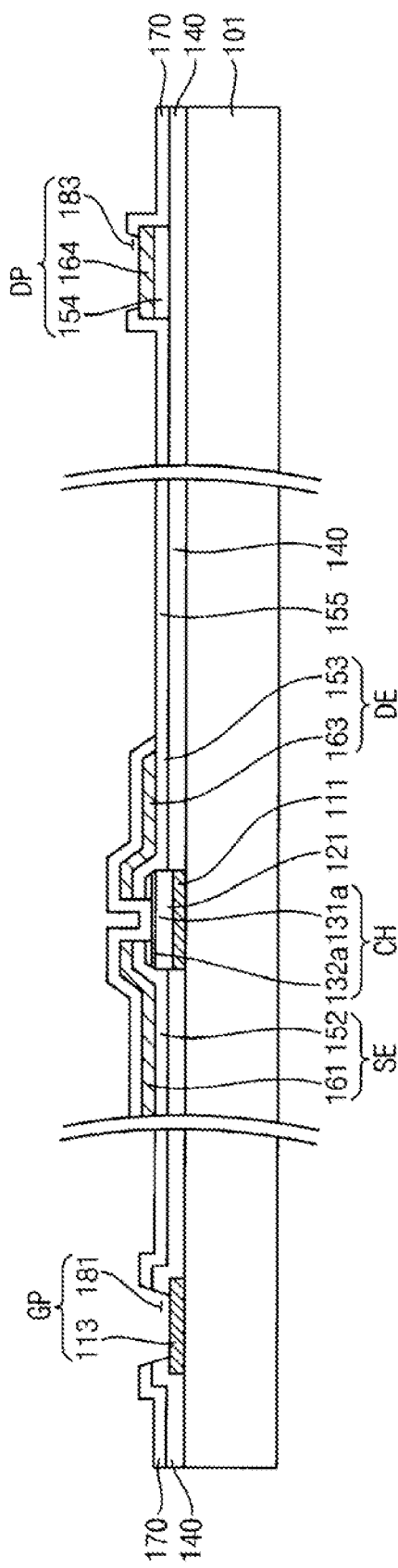

DISPLAY SUBSTRATE HAVING REDUCED DEFECTS

CROSS-REFERENCE TO RELATED APPLICATIONS

This application is a divisional of U.S. patent application Ser. No. 11/644,195 filed Dec. 21, 2006 now U.S. Pat. No. 8,012,813 which claims priority to and the benefit of Korean Patent Application No. 2005-127121 filed in the Korean Intellectual Property Office on Dec. 21, 2005, the entire contents of which are incorporated herein by their references.

FIELD OF THE INVENTION

The present invention relates to an improved display substrate for a Liquid Crystal Display (LCD).

DESCRIPTION OF THE RELATED ART

In general, an LCD includes a thin film transistor substrate, an opposite substrate and a liquid crystal layer disposed between the thin film transistor substrate and the opposite substrate. Gate lines, source lines, switching devices and pixel electrodes are formed on the display substrate. The source lines cross the gate lines. The switching devices are connected to the gate lines and source lines. The pixel electrodes are connected to the switching devices.

Each of the switching devices includes a gate electrode extended from one of the gate lines, a channel insulated from the gate electrode and overlapped by the gate electrode, a source electrode connected to one of the source lines and electronically connected to the channel, and a drain electrode spaced apart from the source electrode and electronically connected to the channel.

When the number of masks required to manufacture the display substrate is decreased, the expense and time required for the manufacturing process is decreased and productivity is improved. In a conventional method of manufacturing a substrate five masks require five processes of patterning gate metal, patterning the channel, patterning the source metal, patterning the contact-hole and patterning a pixel electrode. One mask is used in each process, A method of manufacturing a display substrate using four masks has been developed. The four-mask method is substantially the same as the five mask method except that the channel and the source metal are patterned simultaneously. However, using the four-mask method the channel patterns are overlapped with substantially all of the source metal pattern and, if a portion of the channel pattern protrudes with respect to the source metallic pattern, a switching device leakage current can be induced by light causing defects such as afterimage and flicker.

SUMMARY OF THE INVENTION

In accordance with one embodiment of the present invention, a gate metallic layer, a gate insulation layer and a channel layer are deposited on a base substrate, in sequence. A gate electrode of a switching device is formed. A channel pattern and a gate line are formed on the gate electrode by a first photoresist pattern. A transparent conductive layer and a source metallic layer are deposited on the base substrate having the channel pattern, in sequence. A source electrode and a drain electrode of the switching device, a pixel electrode and a source line electronically connected to the drain electrode, are formed by a second photoresist pattern. A first protective insulation layer is formed. The first protective insulation layer on the pixel electrode is removed by a third photoresist pattern.

According to the above, the display substrate is manufactured by the three masks, and the channel layer may not be formed under the source metallic pattern. Thus, a manufacturing process is simplified, and a display quality is improved.

BRIEF DESCRIPTION OF THE DRAWING

The foregoing and other objects, features and advantages of the present invention will become readily apparent by reference to the following detailed description when considered in conjunction with the accompanying drawings, in which:

FIGS. 4A to 4F are cross-sectional views illustrating the display substrate in FIG. 3;

FIGS. 6A to 6D are cross-sectional views illustrating the display substrate in FIG. 5;

FIGS. 8A to 8B are cross-sectional views illustrating the display substrate in FIG. 7.

DESCRIPTION OF THE EMBODIMENTS

Figure 1:
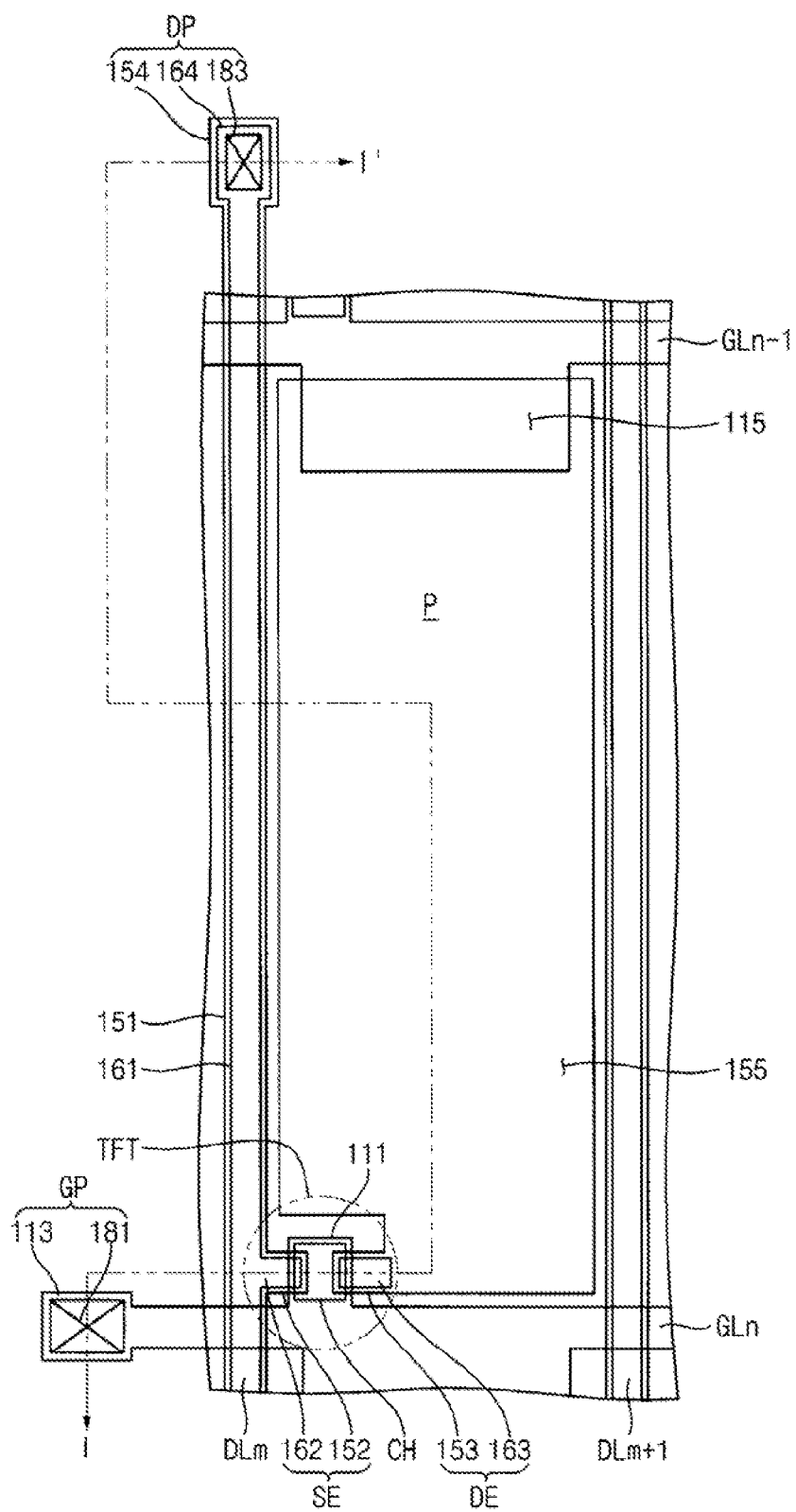
FIG. 1 is a plan view illustrating a display substrate in accordance with a first embodiment of the present invention.

FIG. 1 is a plan view illustrating a display substrate in accordance with a first embodiment of the present invention. Referring to FIG. 1, a display substrate includes a plurality of gate lines GLn−1 and GLn, a plurality of source lines DLm and DLm+1, a pixel portion P, a switching device TFT, a storage common electrode 115 and a pixel electrode 155.

Gate lines GLn−1 and GLn are extended in a first direction, and are formed from a gate metallic layer. The gate metallic layer includes a conductive material. Examples of the conductive material that can be used for the gate metallic layer include copper (Cu), copper alloy, aluminum (Al), aluminum alloy, molybdenum (Mo), molybdenum alloy, chrome (Cr), tantalum (Ta), titanium (Ti), etc.

A gate pad GP including a gate pad electrode 113 and a first contact-hole 181 is formed in an end portion of each of gate lines GLn−1 and GLn.

Source lines DLm and DLm+1 are extended in a second direction crossing the first direction, and have a double layer that has a transparent pattern 151 formed from a transparent conductive layer and a source pattern 161 formed from a source metallic layer 161. The transparent conductive layer 151 and the source metallic layer 161 are deposited in sequence. A source pad DP including a source pad electrode 154 and a second contact-hole 183 is formed in an end portion of each of source lines DLm and DLm+1.

Pixel portion P is defined by gate lines GLn−1 and Gln and source lines DLm and DLm+1. Switching device TFT, storage common electrode 115 and pixel electrode 155 are formed in pixel portion P. Switching device TFT includes a gate electrode 111 extended from one of gate lines GLn−1 and GLn, a source electrode SE extended from one of source lines DLm and DLm+1 and a drain electrode DE electronically connected to pixel electrode 155. Moreover, switching device TFT also includes a channel portion CH that is overlapped with gate electrode 111 and is electronically connected to the source and drain electrodes SE and DE.

Gate electrode 111 is formed from the gate metallic layer. The source electrode SE has a double-layered structure including a transparent pattern 152 formed from the transparent conductive layer and a source pattern 162 formed from the source metallic layer. Drain electrode DE has a double-layered structure including a transparent pattern 153 formed from the transparent conductive layer and a source pattern 163 formed from the source metallic layer. The transparent conductive layer and the source metallic layer are deposited, in sequence.

Storage common electrode 115 is electronically connected to the gate line GLn−1 and is formed under pixel electrode 155 and from the gate metallic layer. A storage capacitor includes storage common electrode 115 as one electrode, a dielectric material, and pixel electrode 155. When a gate off voltage is applied to the previous gate line GLn−1, the storage capacitor applies the gate off voltage to storage common electrode 115 as a common voltage. Thereby, the storage capacitor is driven as an end gate mode to maintain a pixel voltage applied to the pixel electrode 115.

Pixel electrode 155 is formed from the transparent conductive layer and is extended from the transparent pattern 153 of drain electrode DE. The transparent pattern 153 of drain electrode DE includes a transparent conductive material. Examples of the transparent conductive material that can be used for the transparent pattern 153 include indium (In) oxide, tin (Sn) oxide, zinc (Zn) oxide, aluminum (Al) oxide, gallium (Ga) oxide, etc. These can be used alone or in a combination thereof. The transparent conductive material may include an oxide of an alloy of indium (In), tin (Sn), zinc (Zn), aluminum (Al), gallium (Ga), etc.

Figure 2:
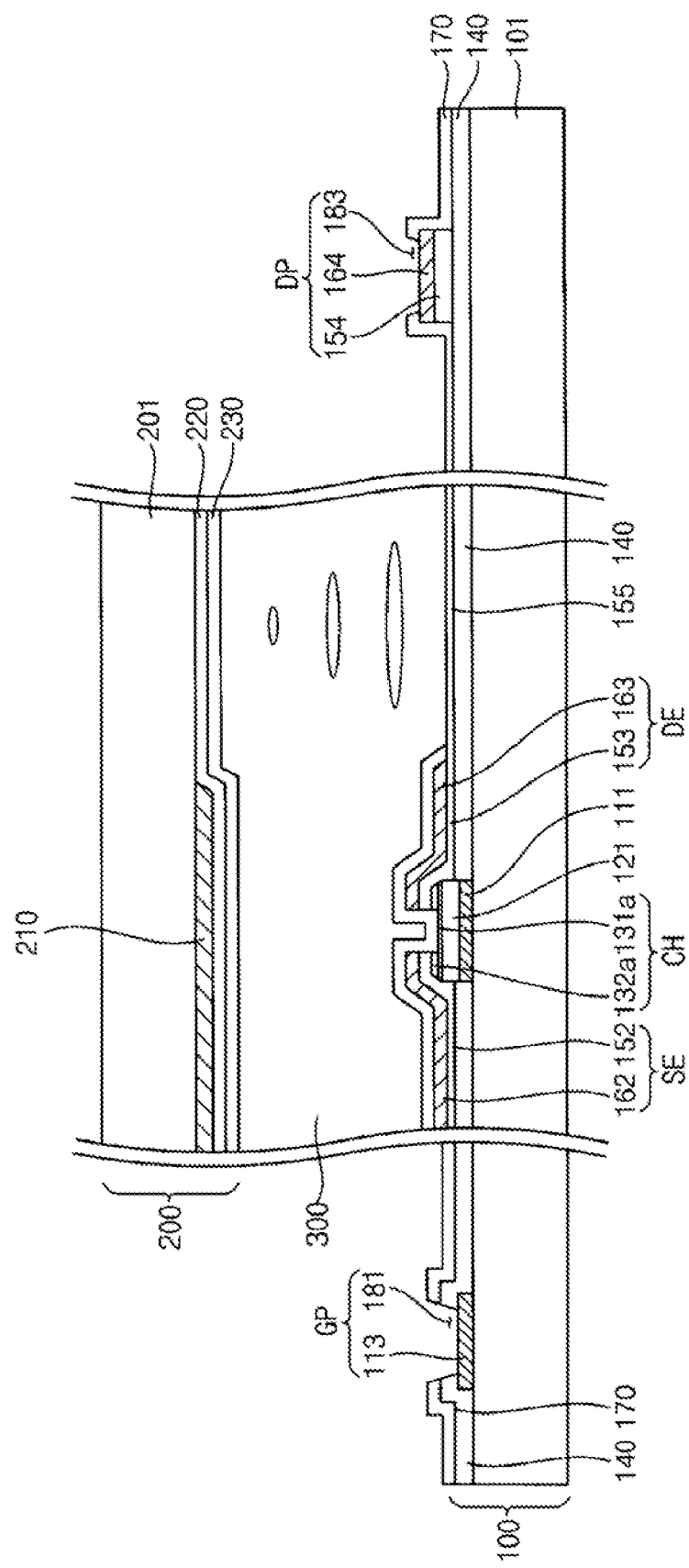
FIG. 2 is a cross-sectional view taken along a line I-I' of the display substrate in FIG. 1.

FIG. 2 is a cross-sectional view taken along a line I-I' of the display substrate in FIG. 1. Referring to FIGS. 1 and 2, a display panel includes an array substrate 100, a color filter substrate 200 facing the array substrate 100, and a liquid crystal layer disposed between the array substrate 100 and the color filter substrate 200.

Substrate 100 includes a base substrate 101. A gate metallic pattern including gate lines GLn−1 and GLn, a gate pad electrode 113, a storage common electrode 115 and a gate electrode 111 is formed on the base substrate 101. The gate metallic pattern is formed from a gate metallic layer. The gate metallic layer includes a conductive material, examples of which include copper (Cu), copper alloy, aluminum (Al), aluminum alloy, molybdenum (Mo), molybdenum alloy, chrome (Cr), tantalum (Ta), titanium (Ti), etc. The gate metallic layer may have a low resistance structure, for example, a multi layered structure such as a molybdenum (Mo) layer and an aluminum (Al) layer. A first protective insulation layer 140 and a second protective insulation layer 170 are deposited on gate lines GLn−1 and GLn, in sequence.

A first protective insulation layer 140 and a second protective insulation layer 170 are partially removed to form a first contact-hole on a gate pad electrode 113 formed on an end portion of each of gate lines GLn−1 and GLn. A gate pad GP is defined by the gate pad electrode 113 exposed through the first contact-hole 181.

The gate insulation layer is patterned to form a gate insulation pattern 121 on gate electrode 111. A channel portion CH is formed on the gate insulation pattern 121, and is overlapped with gate electrode 111. The channel portion CH includes an active layer 131a having amorphous silicon and an ohmic contact layer 132a. Impurities are implanted on an upper portion of an amorphous silicon layer to form the ohmic contact layer 132a. The active layer 131a and the ohmic contact layer 132a are formed on the gate insulation pattern 121, in sequence.

A source electrode SE and a drain electrode DE are formed on the gate insulation pattern 121. The source electrode SE and drain electrode DE are partially overlapped with the channel portion. Each of the source electrode SE and drain electrode DE has a double-layered structure. The source electrode SE includes a transparent pattern 152 formed from a transparent conductive layer and a source pattern 162 formed from a source metallic layer. Drain electrode DE includes a transparent pattern 153 formed from the transparent conductive layer and a drain pattern 163 formed from the source metallic layer. Each of source lines DLm and DLm+1 has a double layered structure that is formed from substantially the same layers as the source and drain electrodes SE and DE.

The source metallic layer includes a conductive material. Examples of the conductive material that can be used for the source metallic layer include copper (Cu), copper alloy, aluminum (Al), aluminum alloy, silver (Ag), silver alloy, molybdenum (Mo), molybdenum alloy, chrome (Cr), tantalum (Ta), titanium (Ti), etc.

Each of the source and the drain electrodes SE and DE is formed from substantially the same double-layered structure. Source lines DLm and DLm+1 are formed from the double-layered structure including a transparent pattern 151 formed from the transparent conductive layer and a source pattern 161 formed from the source metallic layer. The transparent pattern 151 and the source pattern 161 of source lines DLm and DLm+1 are deposited on the first protective insulation layer 140, in sequence.

The second protective insulation layer 170 is formed on the source electrode SE, drain electrode DE and source lines DLm and DLm+1.

The second protective insulation layer 170 corresponding to an end portion of each of source lines DLm and DLm+1 is partially removed to form a second contact-hole on a source pad electrode 154. A source pad DP is defined by the source pad electrode 154 exposed through the second contact-hole 183.

Pixel electrode 155 is extended from the transparent pattern 153 of drain electrode DE to be electrically connected to pixel electrode 155. The first protective insulation layer 140 is formed under pixel electrode 155.

The color filter substrate 200 includes a second base substrate 201, a light blocking pattern 210, a color filter layer 220 and a common electrode layer 230. The light-blocking pattern 210 is formed on the second base substrate 201 to define an inner space corresponding to pixel portion P, and to block leaking light.

The color filter layer 220 includes a plurality of color filter patterns, and each of the color filter patterns is disposed in the inner space. The color filter pattern emits color light in response to incident light. For example, the color filter patterns include red, green and blue filter patterns. An over coating layer may be formed on the color filter layer 220 to planarize the second base substrate 201.

The common electrode layer 230 is formed on the color filter layer 220, and a common voltage is applied to the common electrode layer 230 facing pixel electrode 155 of the array substrate 100. Thereby, a liquid crystal capacitor is defined by a first electrode that is the pixel electrode 115 of pixel portion P, a second electrode that is the common electrode layer 230, and a liquid crystal layer 300 interposed between the pixel electrode 115 and the common electrode layer 230.

The liquid crystal layer 300 is disposed between the array substrate 100 and the color filter substrate 200, and the array substrate 100 is combined with the color filter substrate 200. An arrangement angle of liquid crystal molecules is changed corresponding to the strength of an electric field applied to the common electrode 240 of the color filter substrate 200, thereby an image of a predetermined gray-scale is displayed.

Hereinafter, a method of manufacturing the array substrate in FIG. 2 will be explained in detail with reference to FIGS. 3 to 8B.

Figure 3:
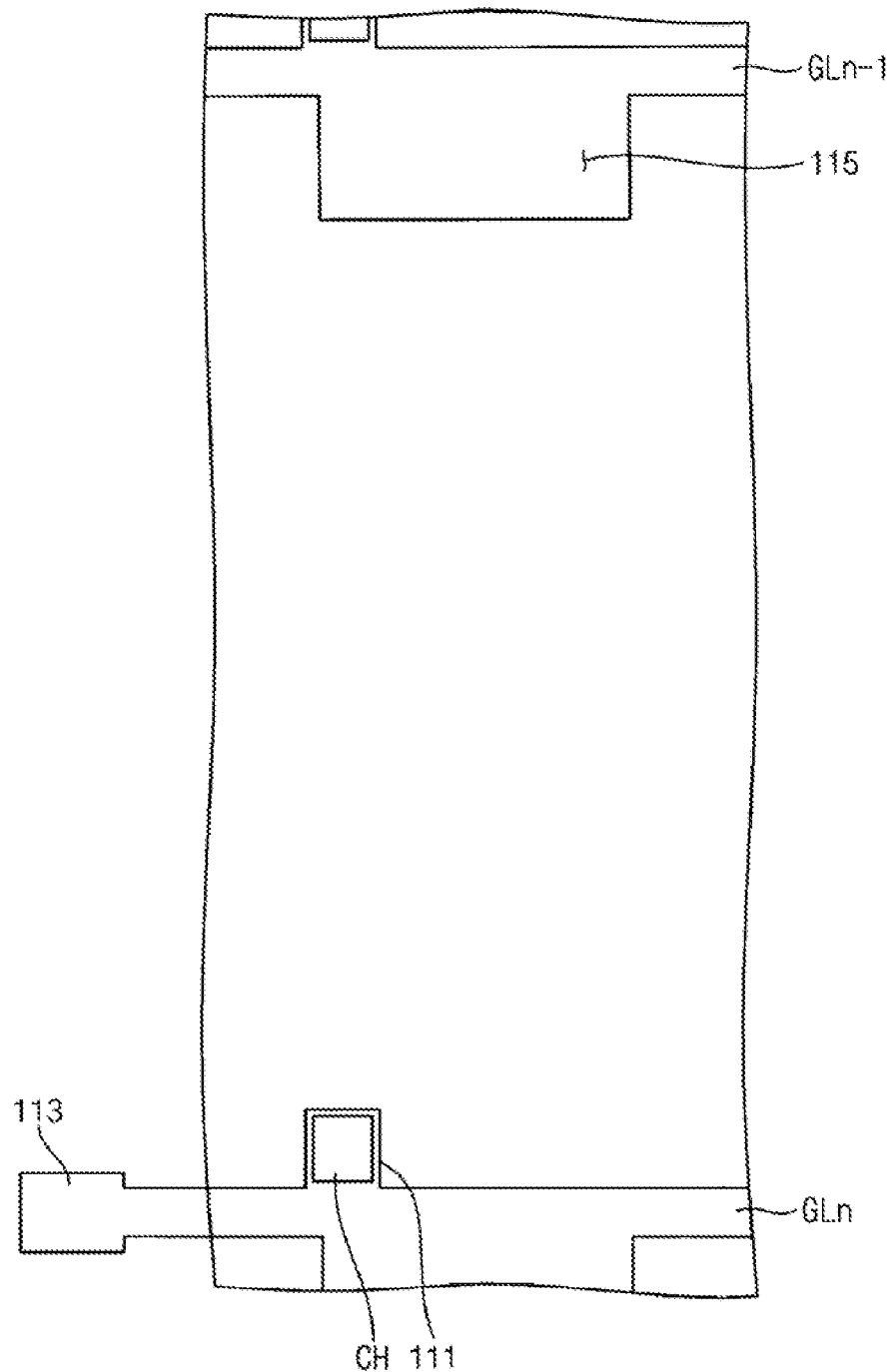
FIG. 3 is a plan view illustrating a display substrate when a first mask process is completed.

FIG. 3 is a plan view illustrating a display substrate when a first mask process is completed. FIGS. 4A to 4F are cross-sectional views illustrating the display substrate in FIG. 3.

Referring to FIGS. 3 and 4A, a gate metallic layer 110, a gate insulation layer 120 and a channel layer 130 are deposited on a first base substrate 101, in sequence. The gate metallic layer 110 includes a low resistant material. Examples of the low resistant material that can be used for the gate metallic layer 110 include chrome, aluminum, tantalum, molybdenum, titanium, tungsten, copper, silver, etc. These can be used alone, an alloy thereof or a combination thereof. The gate insulation layer 120 includes silicon oxide (SiOx) and silicon nitride (SiNx). For example, a thickness of the gate insulation layer 120 may be greater than a thickness of the gate metallic layer 110. The channel layer 130 includes an active layer 131 and an ohmic contact layer 132. The active layer 131 includes amorphous silicon (a-Si). For example, impurities may be implanted into an upper portion of an amorphous silicon layer at a high concentration to form the ohmic contact layer 132.

A first photoresist layer is formed on the first base substrate 101 having the channel layer 130, and the first photoresist layer is patterned to form the first photoresist patterns PR11 and PR12.

The first photoresist patterns PR11 and PR12 include a first pattern PR11 and a second pattern PR12. The first pattern PR11 has a first thickness T1 corresponding to a gate electrode area GEA having a gate electrode 111, and the second pattern PR12 has a second thickness T2 corresponding to a gate pad area GPA having the gate pad electrode 113. When the first photoresist layer includes a positive photoresist, the second pattern PR12 is patterned through a slit portion or a half-tone portion so that the second pattern PR12 has the second thickness T2 that is thinner than the first thickness T1.

The channel layer 130 is etched by a dry etching process using the first photoresist patterns PR11 and PR12 as an etching mask, and the gate insulation layer 120 is etched by a dry etching process using the first photoresist patterns PR11 and PR12 as an etching mask. In addition, the gate metallic layer 110 is etched by a wet etching process using the first photoresist pattern PR11 and PR12 as an etching mask, in sequence.

Figure 4B:
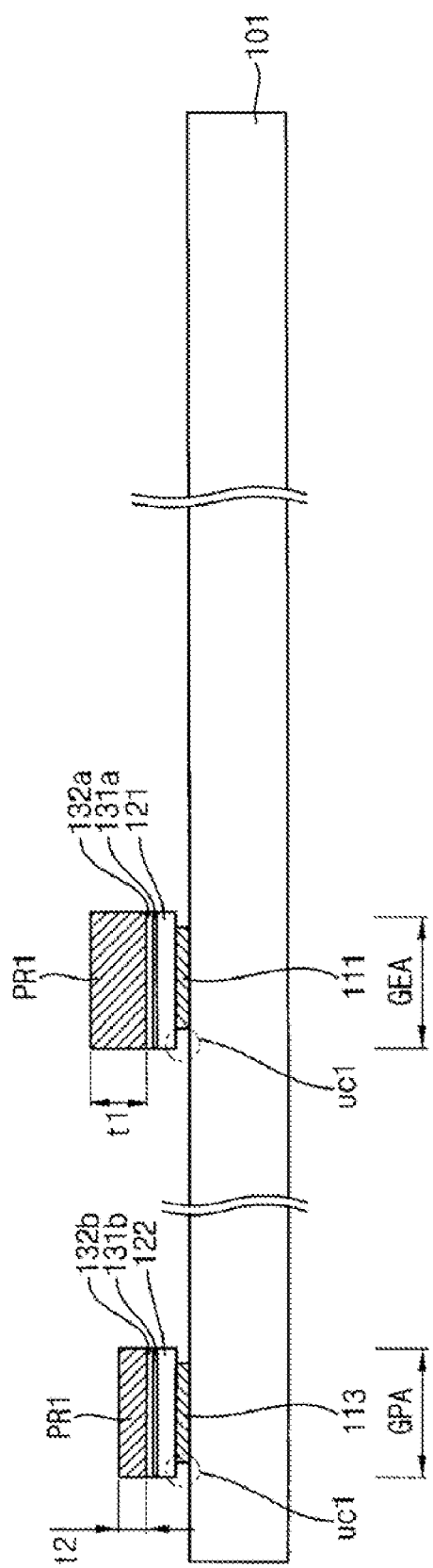

Referring to FIGS. 3 and 4B, the channel layer 130, the gate insulation layer 120 and the gate metallic layer 110 are etched using the first photoresist patterns PR11 and PR12 as the etching mask. Thereby, each of the patterned channel layer 130, gate insulation layer 120 and gate metallic layer 110 are formed in the gate electrode area GEA and the gate pad area GPA.

The gate metallic pattern 111, the gate insulation pattern 121, the active layer 131a and the ohmic contact layer 132a are formed in the gate electrode area GEA. A gate pad metallic pattern 113, a gate pad insulation pattern 122, the pad active layer 131b and the pad ohmic contact layer 132b are formed in the gate pad area GPA. In FIGS. 3 to 4B, the channel layer 130 and the gate insulation layer 120 are etched by the dry etching process, and the gate metallic layer 110 is etched by the wet etching process. Thus, the gate metallic patterns 111 and 113 has an under cut uc1.

Referring to FIGS. 3 to 4C, the first photoresist patterns PR11 and PR12 corresponding to the under cut uc1 is partially removed by an etch back process. The channel patterns 131a, 132a, 131b and 132b and the gate insulation patterns 121 and 122 are patterned to have substantially the same shape as the gate metallic patterns 111 and 113 by a dry etching process. The dry etching process may be a reactive ion-etching mode (RIE mode). The first photoresist patterns PR11 and PR12 are removed at a predetermined thickness by an etch back process. The thickness is between the first thickness T1 and the second thickness T2.

Figure 4D:
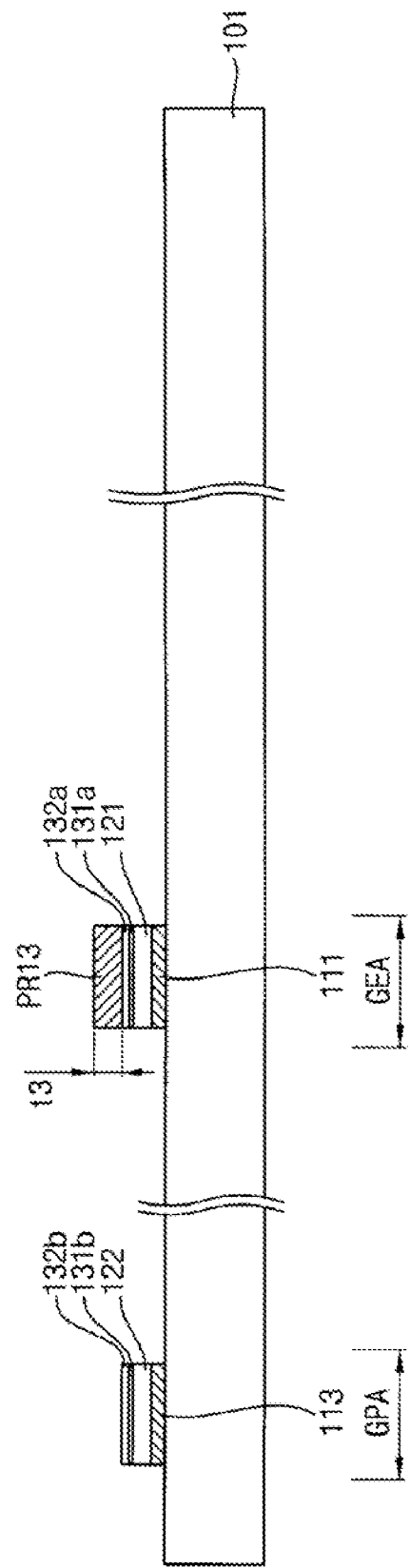

Referring to FIGS. 3 to 4D, the second pattern PR12 formed in the gate pad area GPA is removed by the etch back process, and a third pattern having a third thickness T3 remains in the gate electrode area GEA.

The pad active layer 131b and the pad ohmic contact layer 132b formed in the gate pad area GPA and the gate pad insulation pattern 122 are removed by a dry etching process using a pattern PR13 of the first photoresist pattern PR1 as an etching mask. The dry etching process may be a reactive ion-etching mode (RIE mode). Thus, the channel patterns 131a and 132a, on which the third pattern PR13 remains, remain in the gate electrode area GEA. In addition, a remaining portion of the channel patterns formed on the first base substrate 101 is removed.

Referring to FIGS. 3 and 4E, because of the reactive ion etching mode (RIE mode), the channel pattern 131a, 132a formed under the third pattern PR13 by the reactive ion etching (RIE) mode has an under cut uc2. The under cut uc2 is formed to accelerate a photoresist stripping process.

A first protective layer 140 is formed on the first base substrate 101 having the under cut UC2. The first protective insulation layer 140 includes silicon oxide (SiOx) and silicon nitride (SiNx). A thickness of the first protective insulation layer 140 may be greater than the gate insulation pattern 121.

Referring to FIGS. 3 to 4F, the first photoresist pattern PR13 is removed in the photoresist stripping process. The first protective insulation layer 140 formed on the third pattern PR13 is removed with the third pattern PR13. The first protective insulation layer 140 is not formed on the channel portion CH, and is formed on a remaining portion of the first base substrate 101 except the channel portion CH.

As mentioned above in reference with FIGS. 4A to 4F, with the first photoresist pattern PR1, gate lines GLn-1 and GLn, the gate pad electrode 113, gate electrode 111 of switching device TFT and the channel portion CH of switching device TFT are formed on the first base substrate 101. Moreover, the first insulation layer 140 is formed on gate lines GLn-1 and GLn and the gate pad electrode 113. In addition, the gate insulation pattern 121 is formed between gate electrode 111 and the channel portion CH.

Figure 5:
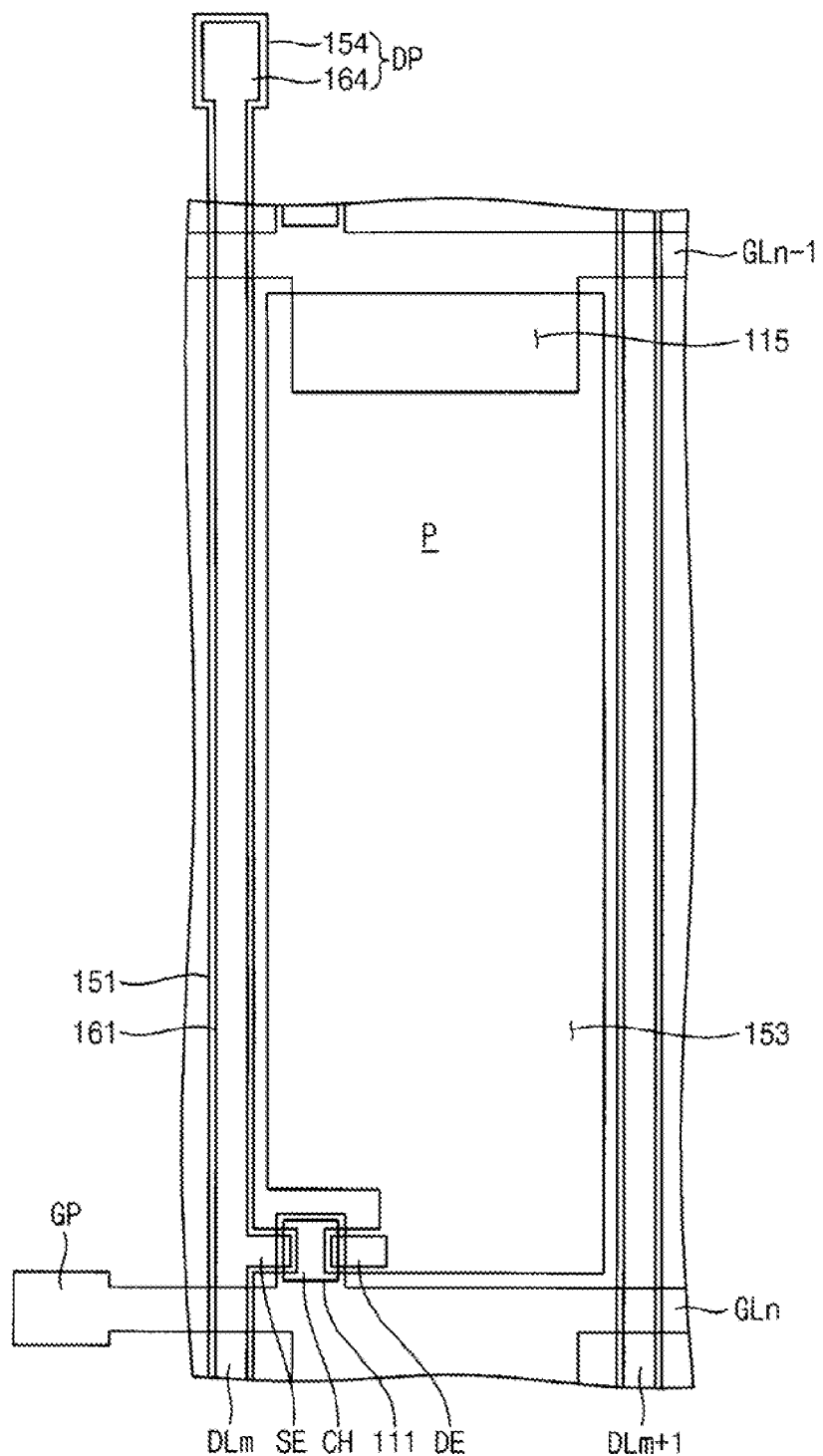
FIG. 5 is a plan view illustrating a display substrate when a second mask process is completed.

FIG. 5 is a plan view illustrating a display substrate when a second mask process is completed. FIGS. 6A to 6D are cross-sectional views illustrating the display substrate in FIG. 5.

Figure 6A:
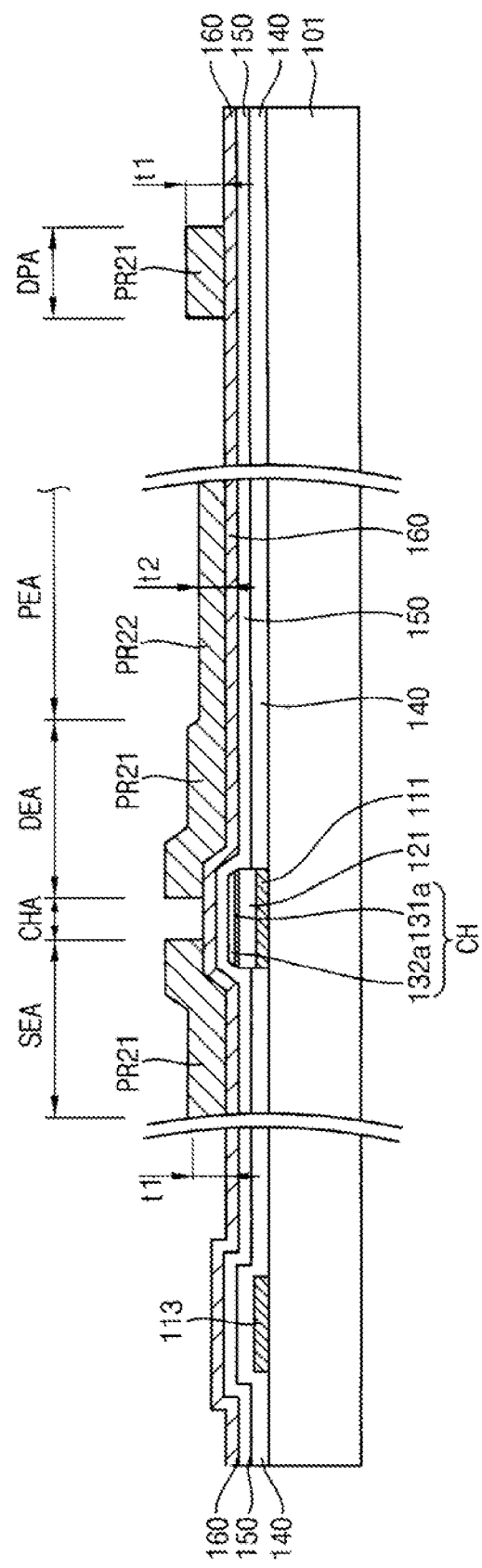

Referring to FIGS. 5 and 6A, a transparent conductive layer 150 and a source metallic layer 160 are deposited on the first base substrate 101 having the channel portion CH of switching device TFT, in sequence. The transparent conductive layer 150 includes a transparent conductive material. Examples of the transparent conductive material that can be used for the transparent conductive layer include indium (In) oxide, tin (Sn) oxide, zinc (Zn) oxide, aluminum (Al) oxide, gallium (Ga) oxide, etc. These can be used alone or in a combination thereof. The transparent conductive material may include an oxide of an alloy of indium (In), tin (Sn), zinc (Zn), aluminum (Al), gallium (Ga), etc.

A second photoresist layer is formed on the first base substrate 101 having the source metallic layer 160. The second photoresist layer is patterned by a second mask to form second photoresist patterns PR21 and PR22.

The second photoresist patterns PR21 and PR22 are formed in a source electrode area SEA having the source electrode SE of switching device TFT, a channel area CHA exposing the active layer 131a, a drain electrode area DEA having drain electrode DE, a pixel electrode area PEA having a pixel electrode 155 (shown in FIG. 1) and a source pad area DPA having a source pad DP. Moreover, the second photoresist patterns PR21 and PR22 may also be formed in a source line area having source lines DLm and Dlm+1. A process for forming source lines DLm and DLm+1 is substantially the same process for forming the source pad DP.

For example, the second photoresist patterns include a first pattern PR21 and a second pattern PR22. The first pattern PR21 of the second photoresist patterns of a first thickness T1 is formed in the drain electrode area DEA and the source pad area SPA. The second pattern PR22 of the second photoresist patterns of a second thickness T2 is formed in the pixel electrode area PEA. When the second photoresist layer includes a positive photoresist, the second pattern PR22 is patterned through a slit portion or a half-tone portion so that the second pattern PR22 of the second photoresist patterns has the second thickness T2 that is thinner than the first thickness T1.

Figure 6B:
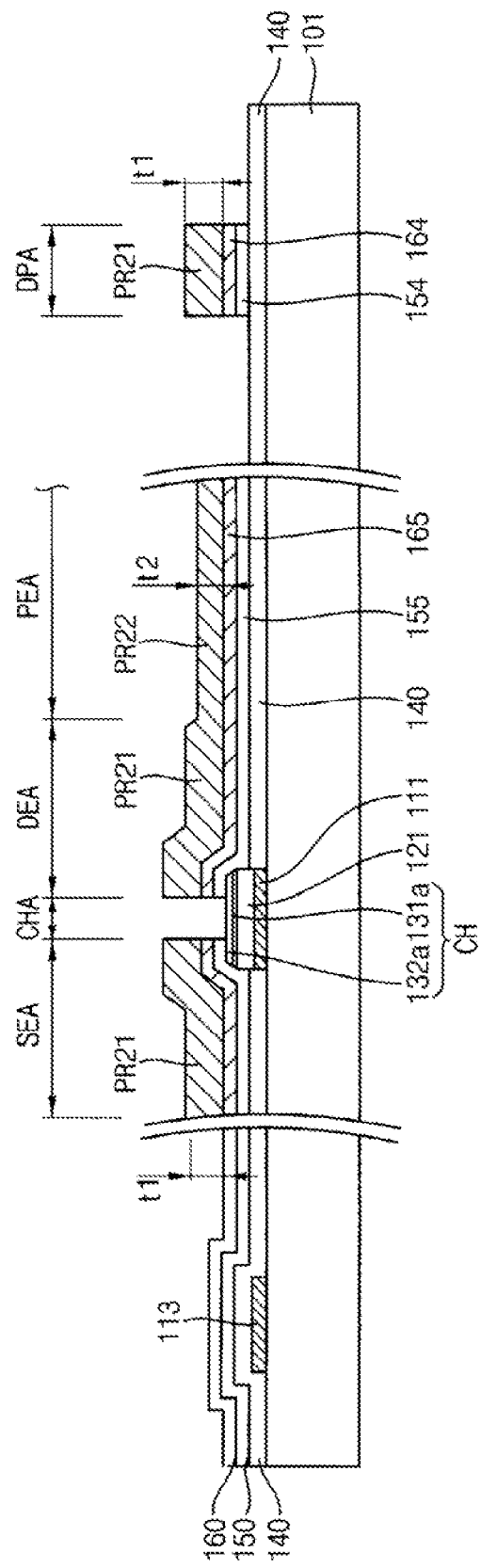

Referring to FIGS. 5 to 6B, the source metallic layer 160 and the transparent conductive layer 150 are etched by a wet etching process using the second photoresist patterns PR21 and PR22 as an etching mask. Thereby, transparent conductive patterns 152, 153 and 154 and source metallic patterns 162, 163 and 164 are formed in the source electrode area SEA, the drain electrode area DEA, the pixel electrode area PEA and the source pad area DPA in which the second photoresist patterns PR21 and PR22 are formed.

For example, the source electrode includes the transparent pattern 152 formed from the transparent conductive layer 150 and the source pattern 162 formed from the source metallic layer 160. In addition, the drain electrode includes the transparent pattern 153 formed from the transparent conductive layer 150 and the source pattern 163 formed from the source metallic layer 160. The pixel electrode includes pixel electrode 155 and a metallic pattern 165.

The second photoresist patterns PR21 and PR22 formed in the source electrode area SEA, the drain electrode area DEA, the pixel electrode area PEA and the source pad area DPA are removed by an etch back process. The removed thickness is more than the first thickness T1 and less than the second thickness T2.

Referring to FIGS. 5 to 6C, the second pattern PR22 formed in the pixel electrode area PEA is removed by the etch back process. In addition, a third pattern PR3 having a third thickness T3 remains on the source electrode area SEA, the drain electrode area DEA and the source pad area DPA.

The metallic pattern 165 in the pixel electrode region PEA is removed by a wet etching process by using a third pattern PR23 of the first pattern PR21 of the second photoresist patterns. Thereby, only pixel electrode 155 remains in the pixel electrode area PEA. For example, the metallic pattern 165 may have a triple layered structure (Mo/Al/Mo) having a molybdenum (Mo) layer, an aluminum (Al) layer and a molybdenum (Mo) layer, in sequence, and pixel electrode 155 may include amorphous indium tin oxide (a-ITO). Etching selectivity between the Mo/Al/Mo metallic layer and the a-ITO conductive layer is high so that one of the Mo/Al/Mo metallic layer and the a-ITO conductive layer may not be damaged in an etching process for etching another Mo/Al/Mo metallic layer and the a-ITO conductive layer.

Therefore, pixel electrode 155 is formed in the pixel electrode area PEA. Hereinafter, a reference number '155' represents the pixel electrodes.

The ohmic contact layer 132a in the channel area CHA is removed through a dry etching process by using the third pattern PR23 as an etching mask to form the channel portion CH of switching device TFT.

Figure 6D:
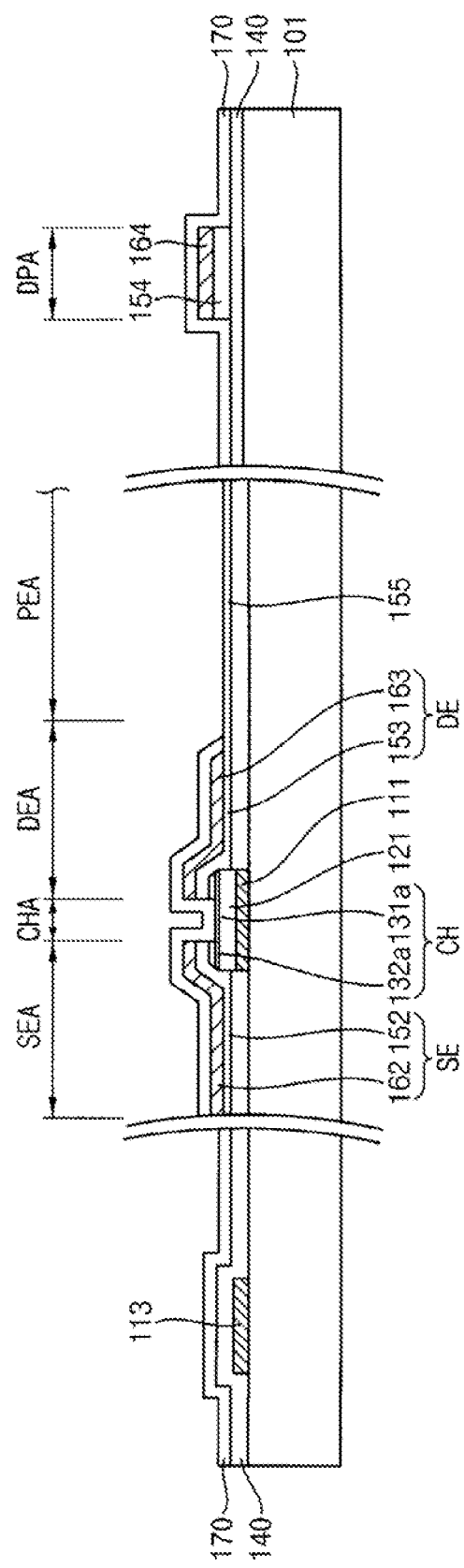

Referring to FIGS. 5 to 6D, the third pattern PR23 of the second photoresist patterns in the source electrode area SEA, the drain electrode area DEA and the source pad area DAP is removed by a stripping process.

The second protective insulation layer 170 is formed on the first base substrate 101 from which the second photoresist pattern PR2 is removed.

As mentioned above in reference with FIGS. 6A to 6D, source lines DLm and DLm+1, pixel electrode 155, the source pad electrode 154 and 164, the source electrode SE and drain electrode DE of switching device TFT are formed on the first base substrate 101 by using the second photoresist pattern PR2 as the etching mask.

Figure 7:
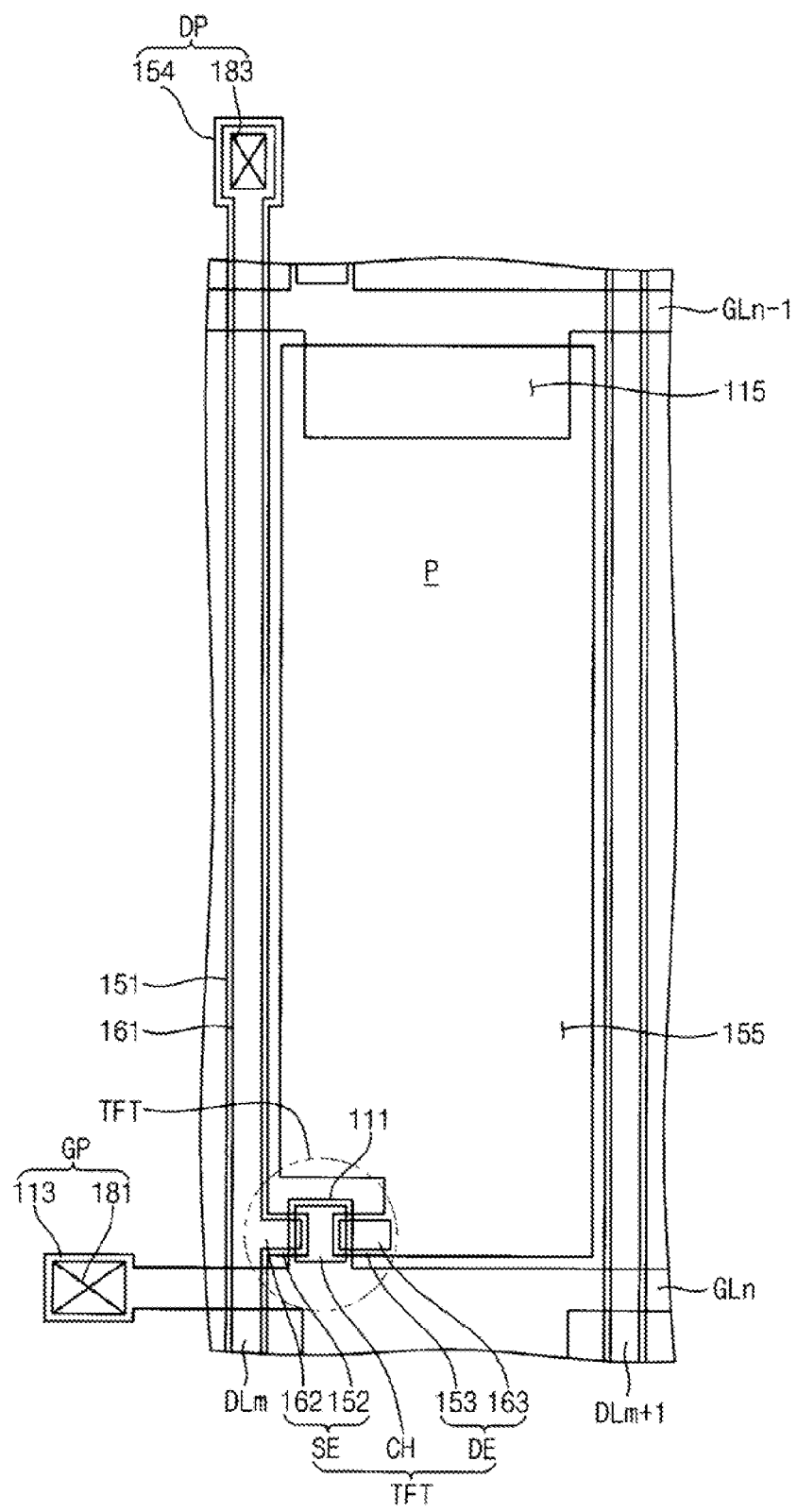
FIG. 7 is a plan view illustrating a display substrate when a third mask process is completed.

FIG. 7 is a plan view illustrating a display substrate when a third mask process is completed. FIGS. 8A to 8B are cross-sectional views illustrating the display substrate in FIG. 7.

Referring to FIGS. 7 and 8A, a third photoresist layer is formed on the first base substrate 101 including the second protective insulation layer 170. The third photoresist pattern is patterned to form the third photoresist patterns PR3 on the first base substrate 101 including the second protective insulation 170.

The third photoresist pattern PR3 is formed in a switching device area SWA having switching device TFT, and a remaining area of the first base substrate 101 except for the pixel electrode area PEA, the first contact-hole area CA1 and the second contact-hole area CA2.

Referring to FIGS. 7 to 8B, the second protective insulation layer 170 of the pixel electrode area PEA is removed through a dry etching process by using the third photoresist patterns PR3 to expose pixel electrode 155. In addition, the second protective insulation layer 170 of the second contact-hole area CA2 is also removed through the dry etching process by using the third photoresist patterns PR3 to form a first contact-hole 181 exposing the gate pad electrode 113. Furthermore, the first and second protective insulation layers 140 and 170 in the first contact-hole area CA1 are over-etched to be removed, thereby forming a second contact hole 183 through which the source pad electrode 164 is partially exposed. The third photoresist pattern PR3 is removed by a stripping process.

Thereby, gate lines GLm−1 and GLn, source lines DLm and DLm+1, switching device TFT and pixel electrode 155 are formed on the first base substrate 101. Switching device TFT includes gate electrode 111, the channel portion CH, the source electrode SE and drain electrode DE. Pixel electrode 155 is integrally formed with drain electrode DE, and is electronically connected to drain electrode DE.

Moreover, the gate pad GP having the gate pad electrode 113 exposed by the first contact-hole 181, and the source pad DP having the source pad electrodes 154 and 164 exposed by the second contact-hole 183 are formed on the first base substrate 101.

The first and second protective insulation layers 140 and 170 are deposited on gate lines GLn−1 and GLn, in sequence.

The second protective insulation layer 170 is formed on source lines DLm and DLm+1.

As mentioned above in reference with FIGS. 8A to 8B, pixel electrode 155, the source pad DP and the gate pad GP are formed on the first base substrate 101 by the third photoresist patterns PR3.

The array substrate having the channel portion CH formed only in switching device TFT is manufactured using the first, second and third photoresist patterns PR1, PR2 and PR3 that are formed through the method for manufacturing the array substrate using three masks.

As mentioned above in accordance with the present invention, the channel layer is not formed under the source metallic layer except for the channel portion of the switching device by the method of manufacturing the display substrate using the three masks. Thus, display defects such as after-image and flicker effect may be decreased.

Although the exemplary embodiments of the present invention have been described, it is understood that various changes and modifications will be apparent to those of ordinary skilled in the art and may be made without, however, departing from the spirit and scope of the invention.

What is claimed is:

1. A display substrate comprising:
    a plurality of gate lines;
    a plurality of source lines crossing the gate lines, and including a transparent conductive layer and a source metallic layer;
    a plurality of pixel portions defined by the gate lines and the source lines;
    a switching device formed at one of the pixel portions, and including a semiconductor layer, a gate electrode extended from the gate lines, a source electrode extended from the source lines and a drain electrode separated from the source electrode; and
    a pixel electrode formed in one of the pixel portions, and extended from the drain electrode of the switching device, the pixel electrode directly contacting the semiconductor layer.

2. The display substrate of claim 1, wherein the semiconductor layer comprises a channel portion formed on the gate electrode, and electrically connected to the source and the drain electrode.

3. The display substrate of claim 1, wherein the drain electrode comprises the transparent conductive layer and the source metallic layer, and the transparent conductive layer is integrally formed with the pixel electrode.

4. The display substrate of claim 1, further comprising:
    a gate pad electrode formed at an end portion of the gate line; and
    a gate pad having a first hole exposing a portion of the gate pad electrode,
    wherein the exposed portion of the gate pad electrode serves as a contact for an external apparatus.

5. The display substrate of claim 1, further comprising a source pad electrode formed at an end portion of the source line, and a source pad having a second hole exposing the source pad electrode,
    wherein the exposed portion of the source pad electrode provides a contact for an external apparatus.

* * * * *